(12) United States Patent
Yamamoto

(10) Patent No.: US 8,378,754 B2
(45) Date of Patent: Feb. 19, 2013

(54) RING OSCILLATOR

(75) Inventor: Kazuhiro Yamamoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 25 days.

(21) Appl. No.: 12/918,629

(22) PCT Filed: Jan. 30, 2009

(86) PCT No.: PCT/JP2009/000368
§ 371 (c)(1),
(2), (4) Date: Aug. 20, 2010

(87) PCT Pub. No.: WO2009/104358
PCT Pub. Date: Aug. 27, 2009

(65) Prior Publication Data
US 2010/0327983 A1    Dec. 30, 2010

(30) Foreign Application Priority Data

Feb. 21, 2008   (JP) ................................. 2008-040388

(51) Int. Cl.
*H03K 3/03* (2006.01)
(52) U.S. Cl. .......................................... 331/57; 331/45
(58) Field of Classification Search ............. 331/57, 331/45
See application file for complete search history.

(56) References Cited

U.S. PATENT DOCUMENTS

| 5,239,274 A * | 8/1993 | Chi ................................. 331/57 |
| 2003/0210101 A1 | 11/2003 | McCorquodale et al. |
| 2007/0090902 A1 | 4/2007 | Deligianni et al. |

FOREIGN PATENT DOCUMENTS

| JP | 01-137628 | 9/1989 |
| JP | 06-194417 A | 7/1994 |
| JP | 2000-035462 A | 2/2000 |

OTHER PUBLICATIONS

PCT International Search Report for PCT Application No. PCT/JP2009/000368 mailed on Feb. 24, 2009.
PCT International Preliminary Report on Patentability (IPRP) for PCT Application No. PCT/JP2009/000368 issued on Oct. 5, 2010.
Office action dated Sep. 24, 2011 for the corresponding Korean Patent Application No. 10-2010-7016699 and its English translation.
Xiaochun Duan, "Frequency-Dmain Simulation of Ring Oscillators with a Multiple-probe Method," Computer-Aided Design of Integrated Circuits and Systems, IEEE Transactions on, vol. 25, No. 12, pp. 2833-2842, Dec. 2006 Fig 5.
Kaman, V., "A 32-element 8-bit photonic true-time-delay system based on a 288 x 288 3-D MEMS optical switch," Photonics Technology Letters, IEEE, vol. 15, No. 6, pp. 849-851, Jun. 2003 Fig 2a.

(Continued)

*Primary Examiner* — Arnold Kinkead
(74) *Attorney, Agent, or Firm* — Ladas & Parry, LLP

(57) ABSTRACT

Multiple multi-stage delay circuits each have n (n is an integer) output terminals. The multi-stage delay circuits each apply delay times to a corresponding input signal, and output, via n output terminals, n delayed signals to which different delay times have been applied. Multiple inverters invert the respective input signals. The multiple multi-stage delay circuits and multiple inverters are alternately connected in the form of a ring.

15 Claims, 20 Drawing Sheets

OTHER PUBLICATIONS

Hiranaka, K., "Self-alignment processed amorphous silicon ring oscillators," Electron Device Letters, IEEE, vol. 5, No. 7, pp. 224-225, Jul. 1984 All.

Office Action issued for related TW application No. 098105174 dated Jul. 19, 2012 and its English translation.

* cited by examiner

100

100a

100b

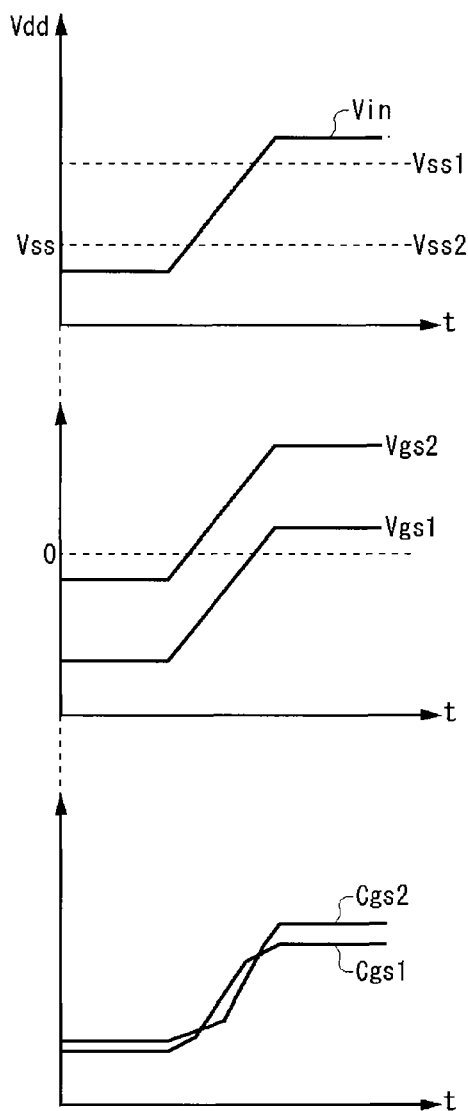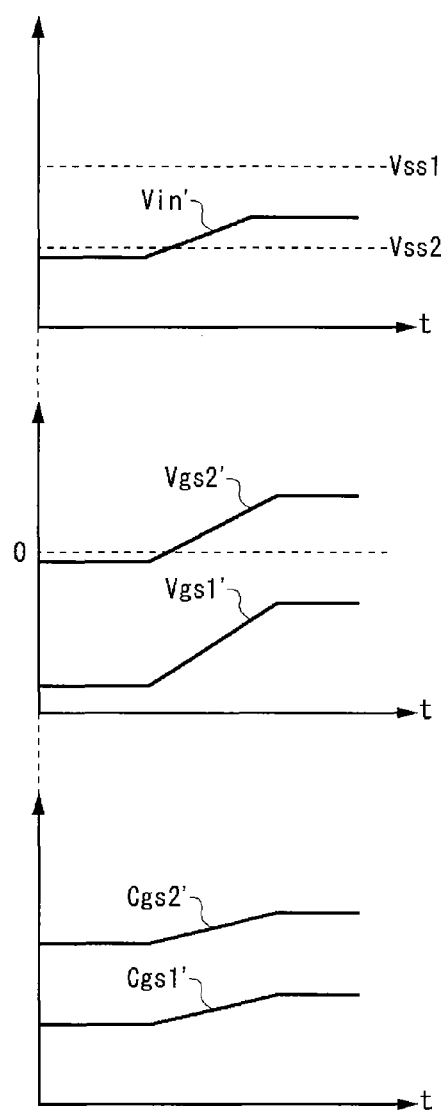

RING OSCILLATOR

This application is the U.S. National Stage of International Patent Application No. PCT/JP2009/000368 filed on Jan. 30, 2009, and claims priority thereto, and further claims priority to Japanese Patent Application No. 2008-040388 filed on Feb. 21, 2008 the disclosures of which is hereby incorporated by reference in its entirety.

BACKGROUND OF THE INVENTION

1. Field of the Invention

The present invention relates to a ring oscillator.

2. Description of the Related Art

In order to provide a clock signal or a cyclic signal having a predetermined frequency, ring oscillators are employed in electronic circuits. A typical ring oscillator has a configuration in which multiple inverters (delay elements) are connected in the form of a ring.

A ring oscillator having such a configuration has a problem in that the frequency of a cyclic signal generated thereby is limited by the delay time of the inverters. That is to say, such a ring oscillator is not capable of generating a cyclic signal having a frequency or a pulse width that is shorter than the delay time of the inverters, which is a problem.

SUMMARY OF THE INVENTION

The present invention has been made in order to solve such a problem. It is an overall purpose of the present invention to provide a multi-phase clock generating circuit having a phase interval shorter than the inverter delay time.

An embodiment of the present invention relates to a ring oscillator. The ring oscillator comprises m (m is an integer) multi-stage delay circuits and m inverters. The m multi-stage delay circuits each include n (n is an integer) output terminals, and configured to apply delay times to an input signal, and to output n delayed signals, to which different delay times have been applied, via the n output terminals. The m multi-stage delay circuits and m inverters are alternately connected in the form of a ring.

Such an embodiment is capable of generating (m×n) multi-phase clock signals at intervals of a delay shift amount represented by $\tau = Tp/(m \times n)$, with the cycle period as Tp. The time interval $\tau 1$ is not limited by the delay time provided by an inverter. The term "inverter" as used here represents an element configured to invert the logical level of a signal, the concept of which include NOR (logical NOR) gates and NAND (logical NAND) gates, in addition to typical inverters.

Also, according to an embodiment, each of the multi-stage delay circuits may comprise: a MOSFET (Metal Oxide Semiconductor Field Effect Transistor); a voltage source configured to apply a voltage difference between a drain and a source of the MOSFET; and multiple taps drawn from a gate electrode of the MOSFET. Also, a signal to be delayed may be propagated through the gate of the MOSFET in the gate width direction. Also, multiple delayed signals, which have been obtained by applying different delay times to the signal to be delayed, may be output via the multiple taps.

With such an embodiment, a distributed constant circuit is defined by the resistance components in the gate width direction, the gate-drain capacitance of the MOSFET, and the gate-source capacitance of the MOSFET. Thus, by setting the gate-drain capacitance, the gate-source capacitance, the gate width (channel width), and the gate length (channel length) to suitable values, such an arrangement is capable of adjusting the resistance components, the inductance components, and the capacitance components of the distributed constant circuit, thereby providing a desired delay time. By employing such a multi-stage delay circuit, such an arrangement is capable of adjusting the cycle of multi-phase clock signals and the phase difference therebetween with high precision.

Also, the voltage source may be capable of adjusting at least one voltage from among a voltage at the drain of the MOSFET, a voltage at the source thereof, and a voltage at a back gate thereof.

The gate-drain capacitance and the gate-source capacitance depend on the gate-drain voltage and the gate-source voltage, respectively. Thus, such an arrangement is capable of adjusting the delay time by adjusting the drain voltage and the source voltage even after the delay circuit is formed on a semiconductor substrate.

Also, with an embodiment, multiple MOSFETs may be provided. Also, the gate electrodes of the MOSFETs may be connected in series so as to form a single propagation line. With such an arrangement, the delay amount can be designed by adjusting the number of the MOSFETs and the gate width of each MOSFET.

Also, the drain electrodes of the multiple MOSFETs may be connected so as to form a common drain electrode, and the source electrodes thereof may be connected so as to form a common source electrode. With such an arrangement, a common drain voltage and a common source voltage may be respectively applied to the common drain electrode and the common source electrode thus formed.

Also, at least one set of electrodes from among the drain electrodes of the multiple MOSFETs and the source electrodes thereof may be provided in the form of separate electrodes provided in increments of MOSFETs such that different bias voltages can be applied to the separate electrodes.

With such an arrangement, the drain voltage or the source voltage of each MOSFET can be adjusted independently, thereby allowing the delay time to be adjusted with high precision.

Also, a multi-stage delay circuit according to an embodiment may further comprise a metal wiring line formed in the gate width direction such that it is overlaid on a gate polysilicon layer of the MOSFET. Also, the metal wiring line may be electrically connected to the polysilicon layer.

In a case in which the gate electrode is formed of polysilicon, it is difficult to settle a high-speed signal due to the high sheet resistance of the polysilicon. This leads to the signal becoming greatly attenuated. In order to solve such a problem, a metal wiring line is employed as a propagation line provided in parallel with the polysilicon line, thereby reducing the resistance value.

Also, a ring oscillator according to an embodiment may further comprise a level shifter arranged as an upstream component of the MOSFET, and configured to adjust the voltage level of the signal to be delayed. Also, the level shifter may be configured to reduce the amplitude of the signal to be delayed.

The gate-source capacitance and the gate-drain capacitance depend on the gate-source voltage and the gate-drain voltage, respectively. That is to say, the gate-source capacitance and the gate-drain capacitance each depend on the voltage level of the signal which is to be delayed and which propagates through the gate. Thus, by adjusting the voltage level of the signal to be delayed, such an arrangement is capable of controlling the delay time.

Also, the wiring width of the wiring line through which a signal is to be propagated may be varied in increments of the intervals between the multiple taps. The wiring length between adjacent taps may also be constant. In some cases, due to the effects of nonlinear properties of the wiring delay element itself, and of circuits connected to the delay circuit such as a circuit configured to apply a signal and a circuit configured to detect a signal, such an arrangement does not provide uniformity in the delay amount even in a case in which the wiring length is constant. In this case, by varying the wiring width, such an arrangement provides uniformity in the delay time.

Also, the overall wiring width of the line through which the signal is propagated may be constant irrespective of which tap is selected from among the taps arranged along the line. Such an arrangement is capable of suitably suppressing signal reflection due to branching of the signal.

It should be noted that any combination of the aforementioned components may be made, and any component of the present invention or any manifestation thereof may be mutually substituted between a method, apparatus, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 14A and 14B are time charts for the delay circuit shown in FIG. 12;

DETAILED DESCRIPTION OF THE INVENTION

Figure 1:
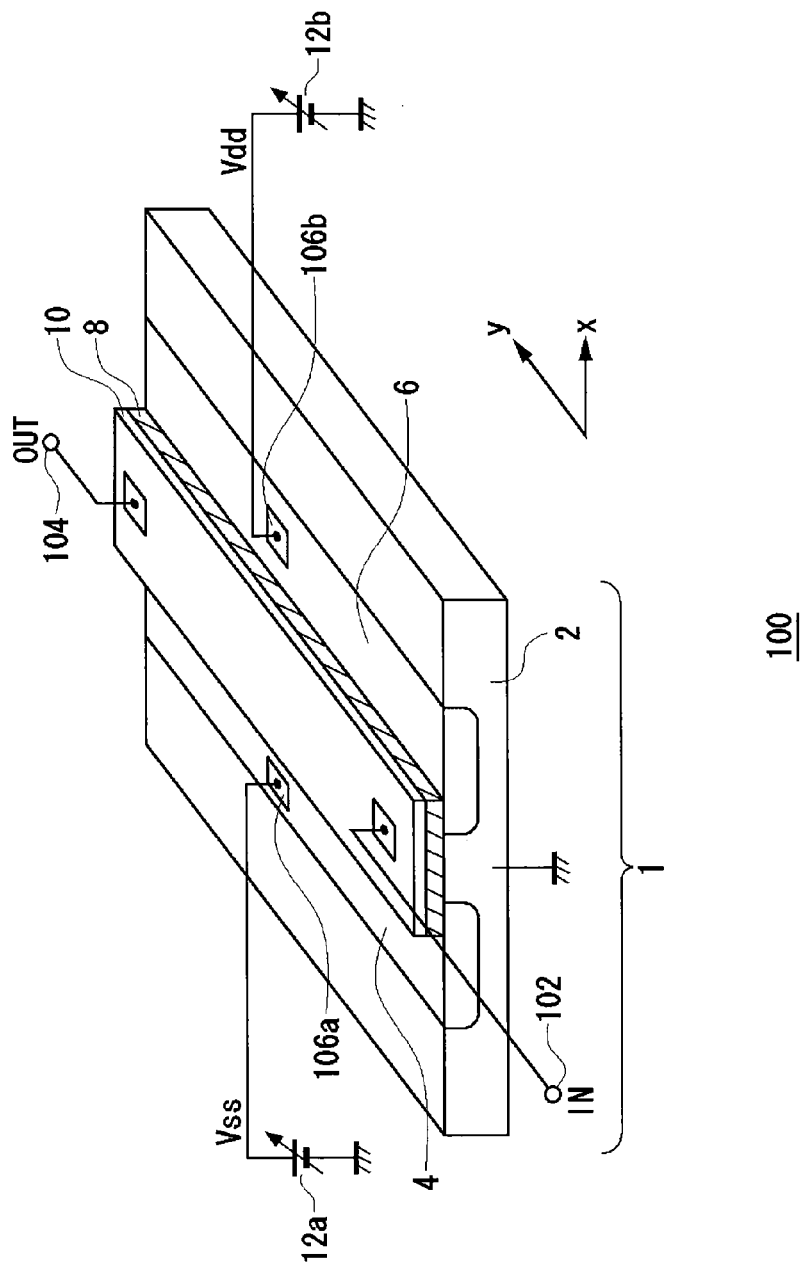
FIG. 1 is a diagram which shows a configuration of a delay circuit according to an embodiment.

Description will be made below regarding preferred embodiments according to the present invention with reference to the drawings. The same or similar components, members, and processes are denoted by the same reference numerals, and redundant description thereof will be omitted as appropriate.

The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

The size of each member shown in the drawings is expanded or reduced as appropriate for ease of understanding. The actual size of each member may vary.

First, description will be made regarding a delay circuit according to an embodiment. FIG. 1 shows a configuration of a delay circuit 100 according to the embodiment. The delay circuit 100 includes a MOSFET 1, bias voltage sources 12a and 12b (which will be collectively referred to as the "bias voltage source 12" hereafter as necessary). The bias voltage sources 12a and 12b apply a voltage difference between the drain and the source of the MOSFET 1. Specifically, the bias voltage source 12a supplies a source voltage Vss to a source electrode 106a of the MOSFET 1. The bias voltage source 12b supplies a drain voltage Vdd to a drain electrode 106b of the MOSFET 1. It should be noted that at least one of the bias voltage source 12a or 12b may be replaced by the ground potential. Whether the MOSFET is an N-channel MOSFET or a P-channel MOSFET is not restricted in particular. It should be noted that, in the present specification, the drain voltage, the source voltage, and the back gate voltage of the MOSFET 1 will be collectively referred to as the "bias voltage".

The MOSFET 1 has the same device configuration as those of typical MOSFETs. Accordingly, description thereof will be made in brief. That is to say, the MOSFET 1 includes a source region 4, a drain region 6, and a gate insulating film 8, formed on a semiconductor substrate 2 such as a silicon substrate or the like. A gate electrode 10 is formed on the gate insulating film 8. In the present embodiment, the gate electrode 10 of the MOSFET 1 is used as a propagation line. An input signal IN to be delayed is propagated through the gate of the MOSFET 1 in the gate-width direction (y direction). Specifically, an input terminal 102 is provided at one end of the gate electrode 10 of the MOSFET 1, and an output terminal 104 is provided at the other end thereof. An input signal IN is supplied to the input terminal 102, and a delayed output signal OUT is output via the output terminal 104.

Figure 2A:
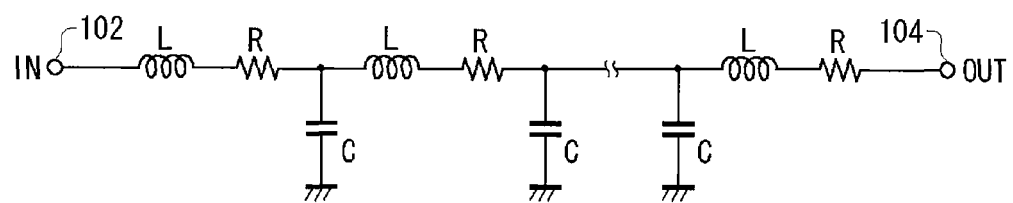
FIGS. 2A and 2B are respectively an equivalent circuit diagram showing an equivalent circuit of the delay circuit shown in FIG. 1 and a diagram showing circuit symbols thereof.
Figure 2B:
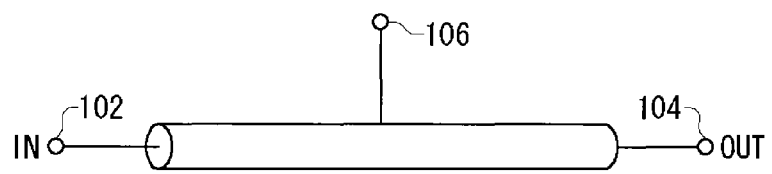

FIGS. 2A and 2B are respectively an equivalent circuit diagram showing an equivalent circuit of the delay circuit 100 shown in FIG. 1 and a diagram showing circuit symbols. As shown in FIG. 2A, the delay circuit 100 shown in FIG. 1 can be represented by a distributed constant circuit. That is to say, there are resistance components R and inductance components L in the signal propagation direction with respect to frequencies ranging from hundreds of megahertz to several gigahertz. Either the resistance component R or the inductance component L becomes dominant, or both components become dominant, according to the frequency. Furthermore, a gate-source capacitance Cgs occurs between the gate and the source of the MOSFET 1, and a gate-drain capacitance Cgd occurs between the gate and the drain thereof. Accordingly, a capacitance component C occurs between the wiring line and the ground.

If a high-frequency signal propagates through the distributed constant circuit shown in FIG. 2A, delay occurs according to the propagation length. Thus, the delay circuit 100 shown in FIG. 1 is capable of applying a desired delay time to the input signal IN. Description will be made below regarding the delay circuit 100 shown in FIG. 1 with reference to the circuit symbols shown in FIG. 2B.

Returning to FIG. 1, the bias voltage source 12 is capable of adjusting at least one of the drain voltage Vdd and the source voltage Vss of the MOSFET 1. For example, the bias voltage source 12a may be configured as a variable voltage source, thereby allowing the source voltage Vss to be adjusted. Also, the bias voltage source 12b may be configured as a variable voltage source, thereby allowing the drain voltage Vdd to be adjusted. Also, an arrangement may be made which is capable of adjusting the back gate voltage of the MOSFET 1. The gate-source capacitance Cgs of the MOSFET 1 and the gate-drain capacitance Cgd thereof each depend on the bias state of the gate, source, and the drain. Thus, by adjusting the source voltage Vss, the drain voltage Vdd, or the like, such an arrangement is capable of adjusting the capacitance Cgs or Cgd. This enables the capacitor C shown in FIG. 2B to be adjusted, thereby allowing the delay circuit 100 to suitably control the delay amount to be applied to the input signal IN.

Figure 3:
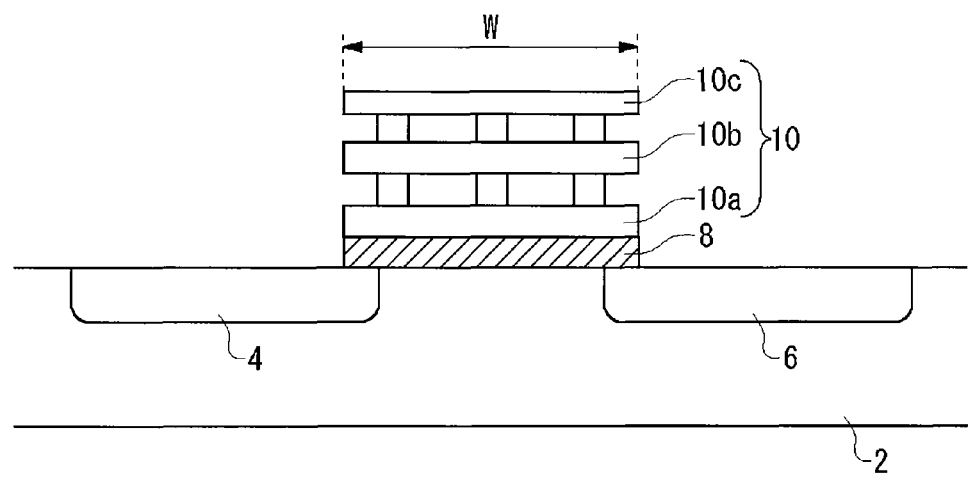
FIG. 3 is a diagram which shows a modification of the delay circuit shown in FIG. 1.

FIG. 3 is a diagram which shows a modification of the delay circuit 100 shown in FIG. 1. The gate electrode 10 of the MOSFET is typically formed of polysilicon. The sheet resistance of polysilicon is relatively higher than that of an aluminum wiring line, and is on the order of 10 Ω/square. With the delay circuit 100 according to the present embodiment, the input signal IN propagates over the gate electrode 10. Accordingly, if the sheet resistance is high, it leads to difficulty in settling a high-speed signal or to the signal becoming greatly attenuated. In order to solve such problems, the effective wiring width can be increased by increasing the gate length (channel length). However, such an arrangement involves an increase in the circuit area, which is undesirable.

In the modification shown in FIG. 3, the gate electrode 10 has a multi-layer structure. That is to say, the gate electrode 10 has a three-layer structure in which a polysilicon layer 10a and metal wiring layers 10b and 10c are layered, thereby reducing the effective resistance component R. The metal wiring layers 10b and 10c are formed in the gate width direction (perpendicular to the view shown in FIG. 3) such that they are overlaid on the polysilicon layer 10a of the MOSFET 1, and are electrically connected to the polysilicon layer 10a through via holes.

The number of layers in the metal wiring layers 10b and 10c can be determined as desired, and should be determined so as to provide a desired resistance value. Furthermore, with the modification shown in FIG. 3, capacitance occurs between the polysilicon layer 10a and the metal wiring layer 10b, and between the polysilicon layer 10a and the metal wiring layer 10b. Thus, by adjusting the number of metal wiring layers and the line width W, such an arrangement provides an additional capacitance component in addition to the gate-source capacitance Cgs and the gate-drain capacitance Cgd of the MOSFET 1.

Figure 4:
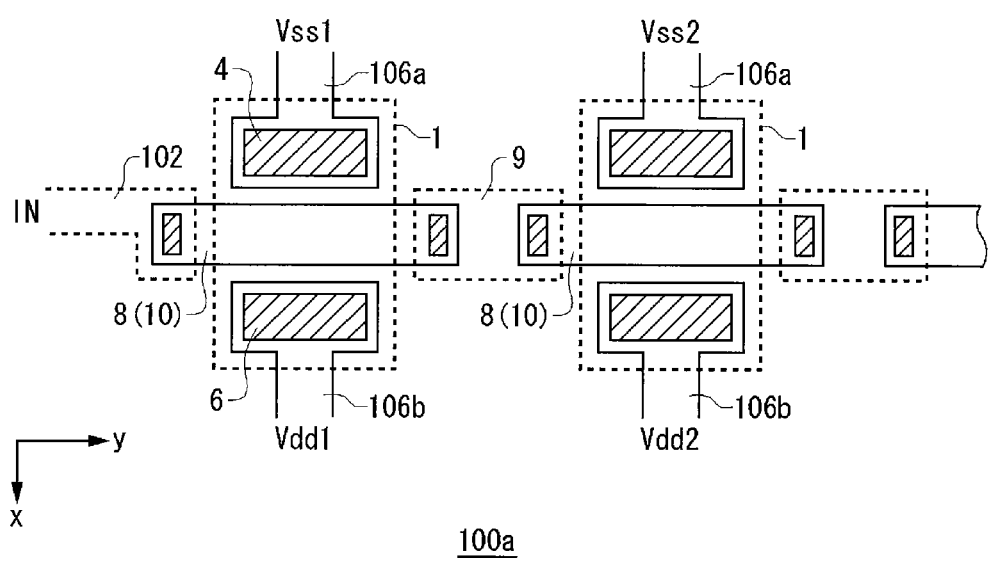
FIG. 4 is a delay circuit including multiple MOSFETs.

In a case in which there is a need to provide a large amount of delay, there is a need to provide a MOSFET 1 having a large gate width. In some cases, if the gate width becomes excessively large, it leads to difficulty in forming the MOSFET 1 due to the constraints imposed by the process rule. In this case, multiple MOSFETs 1 may be connected such that they form a multi-stage MOSFET configuration. FIG. 4 is a diagram which shows a delay circuit 100a including multiple MOSFETs 1. The gate electrodes of the multiple MOSFETs 1 are connected in series such that they form a single propagation path. In FIG. 4, the multiple MOSFETs 1 are arranged adjacent to one another along the gate width direction (y-axis direction). It should be noted that FIG. 4 shows an arrangement employing two MOSFETs 1. However, the number of MOSFETs 1 connected so as to form a multi-stage configuration can be determined as desired. Delay circuits according to various modifications will be collectively referred to simply as the delay circuit 100 hereafter.

The gate electrodes 10 of the adjacent MOSFETs 1 are connected via a metal wiring line 9 so as to form a common gate electrode, and the input signal IN propagates through the gate electrodes 10 thus commonly connected. Moreover, a pair of the bias electrode 106a (drain electrode) and bias electrode 106b (source electrode) is independently provided to each of the MOSFETs 1. Such an arrangement allows different bias voltages to be supplied to the respective MOSFETs 1. With the delay circuit 100a shown in FIG. 4, by independently adjusting the bias voltages in increments of MOSFETs 1, the delay time can be finely adjusted. It should be noted that either one of, or both, sets of the bias terminals 106a and the bias terminals 106b may be connected so as to form a common bias electrode, and a common bias voltage may be supplied to the common bias terminal thus formed. Description has been made with reference to FIG. 4 regarding an arrangement in which the delay circuits 100 are arranged adjacent to one another in the gate width direction. Also, the delay circuits 100 may be arranged in the gate length direction (the x-axis direction). In this case, the manner in which each metal wiring line 9 that connects adjacent gate electrodes 10 is formed should be revised.

The delay circuit 100 described above can be used at a desired position in a semiconductor circuit where a delay is required. The delay time can be adjusted according to the bias voltage (drain voltage, source voltage, or back gate voltage) of the MOSFET 1.

Description has been made with reference to FIG. 1 through FIG. 4 regarding a delay circuit configured to receive an input signal IN, and to output a single delay signal OUT. Next, description will be made regarding a multi-stage delay circuit configured to apply different delay times τ1 through τn to an input signal IN to be delayed, and to output multiple delayed signals OUT1 through OUTn thus delayed.

Figure 5:
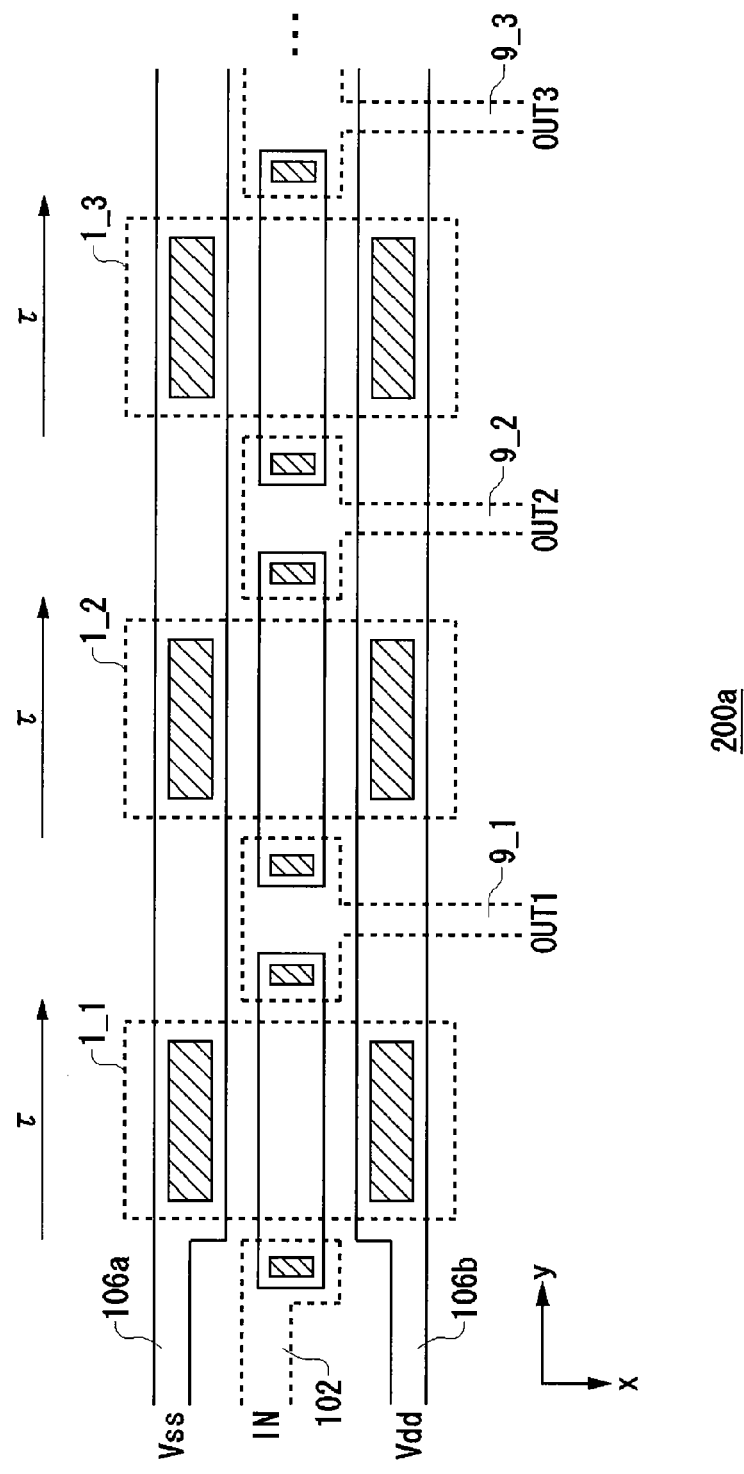
FIG. 5 is a diagram which shows a configuration of a multi-stage delay circuit.

FIG. 5 is a diagram which shows a configuration of a multi-stage delay circuit 200a. The multi-stage delay circuit 200a shown in FIG. 5 employs the configuration of the delay circuit shown in FIG. 1 through FIG. 4. Accordingly, description will be made principally regarding the difference. The multi-stage delay circuit 200a includes multiple MOSFETs 1_1 through 1_3 (which will be collectively referred to as the "MOSFETs 1"). The gate electrodes 10 of the MOSFETs 1 are connected via the metal wiring lines 9 so as to form a common gate electrode. The source electrodes 106a of the multiple MOSFETs 1 are connected so as to form a common source electrode, and a common source voltage Vss is supplied to the common source terminal thus formed. In the same way, the drain electrodes 106 of the multiple MOSFETs 1 are connected so as to form a common drain electrode, and a common drain voltage Vdd is supplied to the common drain electrode thus formed.

Each of the metal wiring lines 9_1 through 9_3, which connects the gate electrodes 10 of adjacent MOSFETs 1, functions as a tap which allows a delayed signal to be output via the gate electrode through which the signal propagates. That is to say, the metal wiring lines (which will also be referred to as "taps" hereafter) 9_1 through 9_3 are arranged at separate positions along the gate width direction (y axis direction). Such an arrangement outputs, via the multiple taps 9, multiple delayed signals to which different delay times OUT1 through OUTn have been applied.

With the multi-stage delay circuit 200a shown in FIG. 5, the input signal IN is delayed by a unit of delay time τ every time the input signal IN propagates through a single MOSFET 1. Thus, such an arrangement provides, via the i-th tap 9_i, an output signal OUTi obtained by delaying the input signal IN by τi=τ×i.

Also, instead of the configuration in which the drain electrodes and the source electrodes are respectively connected so as to form a common drain electrode and a common source electrode, the multi-stage delay circuit 200a may have a configuration in which the drain electrodes and the source electrodes are provided separately as shown in FIG. 4, which allows different drain voltages or different source voltages to be applied to the respective drain electrodes or source electrodes. Such an arrangement allows different unit delay times τ to be set in increments of the MOSFETs 1_1 through 1_3.

Figure 6:
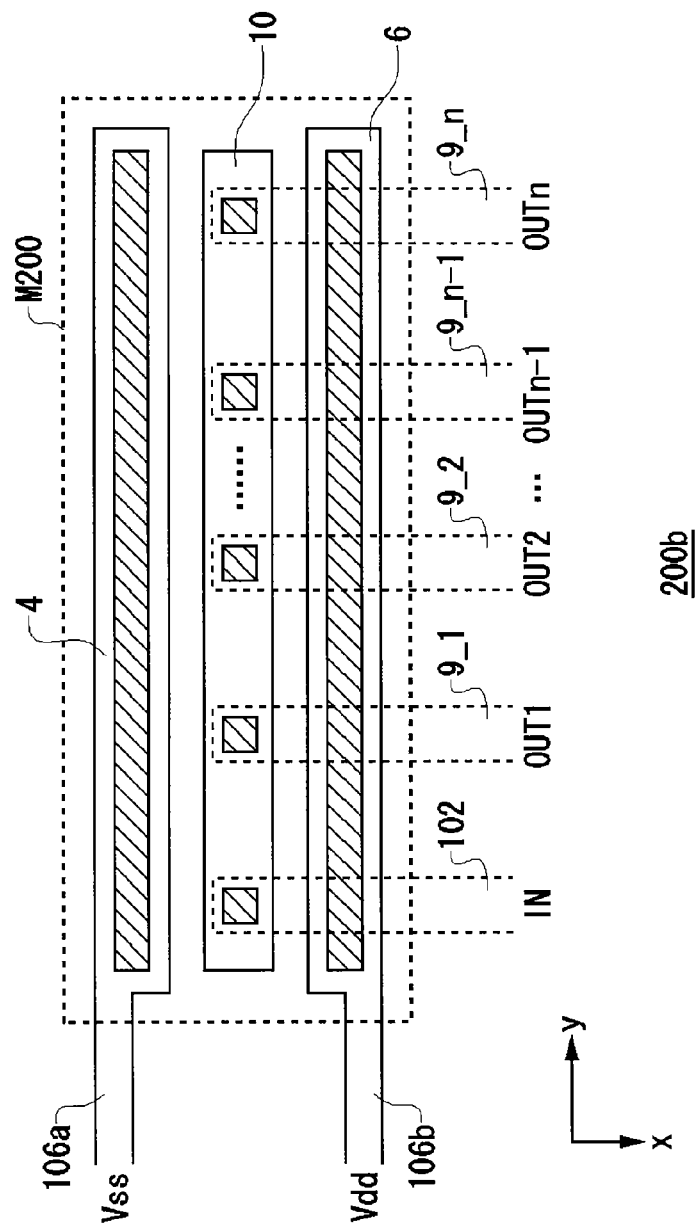
FIG. 6 is a diagram which shows another configuration of a multi-stage delay circuit.

FIG. 6 is a diagram which shows another configuration of a multi-stage delay circuit 200b. The multi-stage delay circuit 200b has a configuration using a single MOSFET 1, having multiple taps 9_1 through 9_n at separate positions along the gate width direction (y-axis direction). With the circuit shown in FIG. 6, delay times that correspond to the intervals between the input terminal 102 and the respective taps 9_1 through 9_n can be applied to the respective output signals OUT1 through OUTn. Furthermore, the delay times to be applied to the respective output signals OUT1 through OUTn can be minutely adjusted by adjusting the source voltage Vss or the drain voltage Vdd.

With the ideal multi-stage delay circuits 200a and 200b shown in FIG. 5 and FIG. 6, the delay amount that occurs between the input terminal 102 and each tap 9 is proportional to the wiring length (gate width) between the input terminal 102 and the tap 9 as long as the bias remains in a constant state. However, in actual circuits, the delay circuit 100 itself and a circuit which applies a signal (a circuit on the input side of the delay circuit 100) have nonlinear characteristics, and thus, in some cases, the delay amount cannot be uniform even if the taps 9 are arranged at constant intervals. In order to solve such a problem, the wiring width, i.e., the width of the gate electrode 10, may be adjusted for each of the taps. By adjusting the wiring width, such an arrangement is capable of providing uniformity in the delay time.

In a case in which a signal is branched via each tap 9 thus formed as shown in FIG. 5 or FIG. 6, in some cases, signal reflection occurs due to impedance mismatching. In this case, the reflected signal is superimposed on the next pulse signal, leading to fluctuation of timing. The following approach is effective for solving such a problem.

Figure 7:
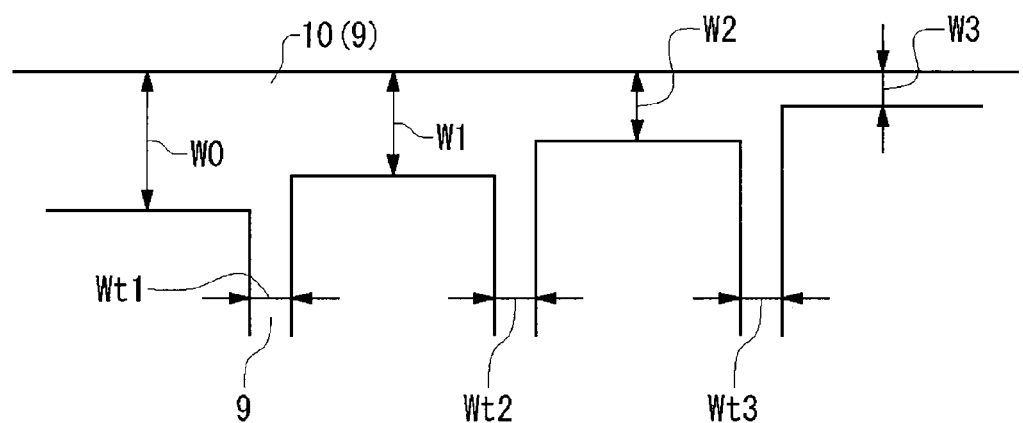
FIG. 7 is a diagram which shows a modification of the line pattern through which a signal to be delayed is to be propagated.

FIG. 7 is a diagram which shows a modification of the line pattern via which a signal to be delayed propagates. In the line pattern shown in FIG. 7, the overall wiring width is constant irrespective of which tap is selected from among the taps arranged along the gate electrode 10 (or metal wiring line 9). That is to say, the following relation is satisfied.

$$W0 = W1 + Wt1$$

$$W1 = W2 + Wt2$$

$$W2 = W3 + Wt3$$

By forming a wiring pattern in such a manner, such an arrangement is capable of compensating for the effects of signal reflection, thereby suppressing fluctuation of the pulse signal timing.

Figure 8:
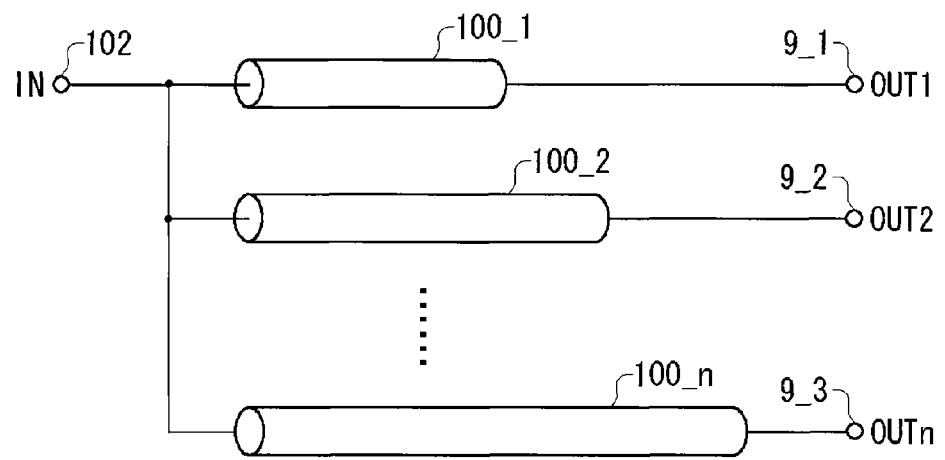
FIG. 8 is a diagram which shows a configuration of a multi-stage delay circuit.

FIG. 8 is a diagram which shows a configuration of a third multi-stage delay circuit 200c. The multi-stage delay circuit 200a shown in FIG. 5 has a configuration in which the MOSFETs 1 are connected in series along the signal propagation direction. In contrast, the multi-stage delay circuit 200c shown in FIG. 8 includes multiple delay circuits 100_1 through 100_n arranged in parallel such that the input terminals thereof are connected so as to form a common input terminal. The multi-stage delay circuit 200c shown in FIG. 8 is capable of generating multiple output signals OUT1 through OUTn that have been subjected to different delay times in the same way as with the multi-stage delay circuit 200 shown in FIG. 5 and FIG. 6.

Figure 9:
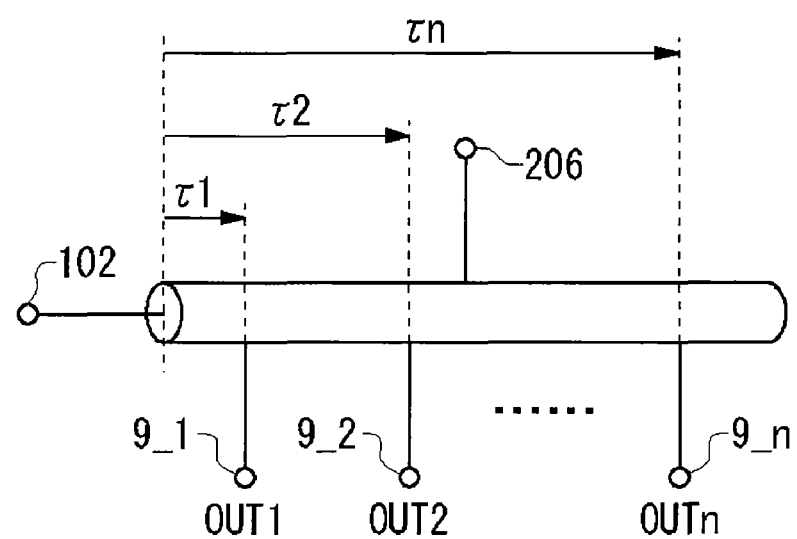
FIG. 9 is a diagram which shows the circuit symbols of the multi-stage delay circuit shown in FIGS. 5 through 8.

FIG. 9 is a diagram which shows the circuit symbols of the multi-stage delay circuits 200a through 200c shown in FIG. 5 through FIG. 8. A bias terminal 206 is a terminal provided in order to provide fine adjustment of the delay time, and corresponds to the bias terminals 106a and 106b shown in FIG. 5 and FIG. 6. Each of the multi-stage circuits 200a through 200c will be collectively referred to simply as the "multi-stage delay circuit 200" hereafter.

Figure 10:
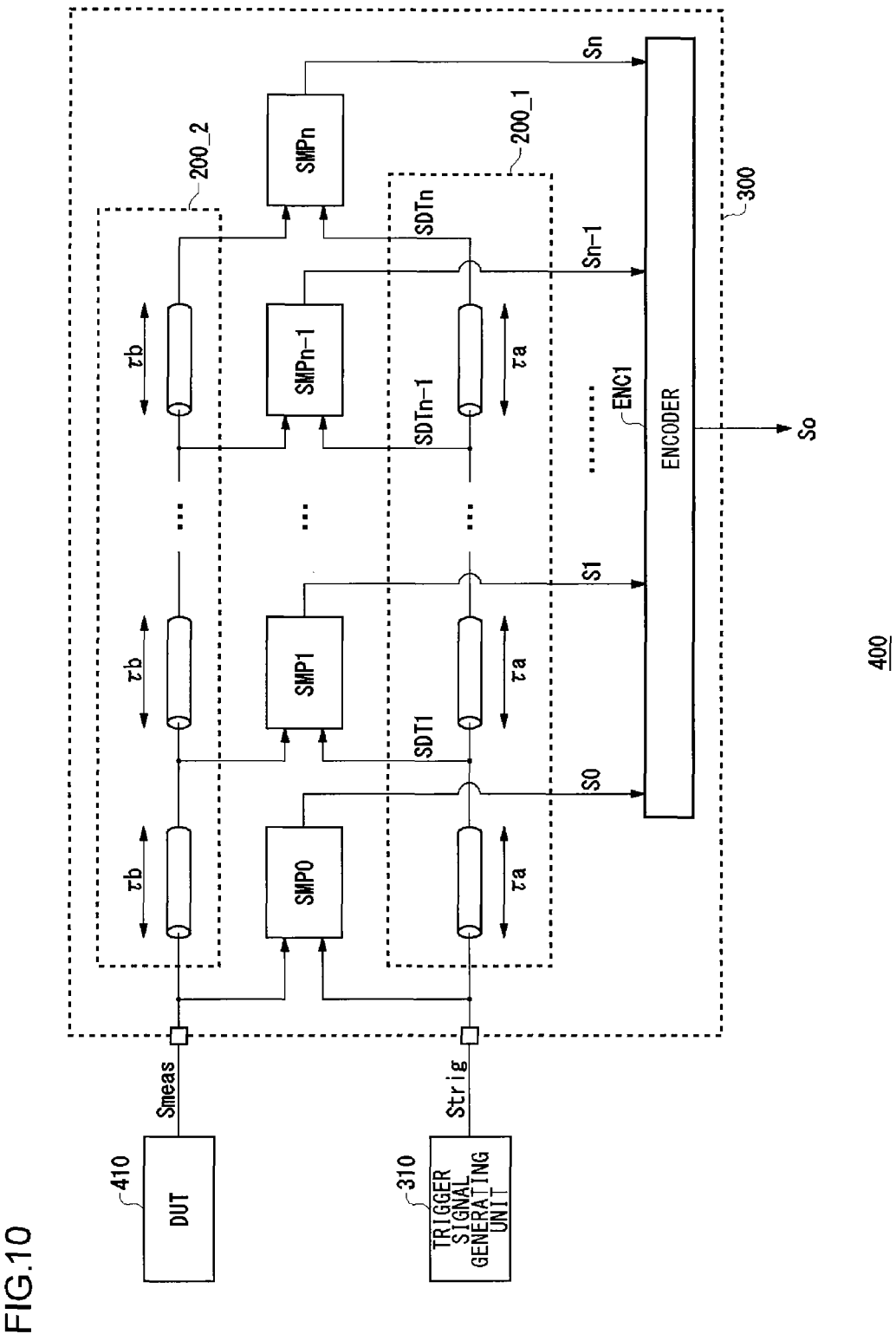
FIG. 10 is a circuit diagram which shows a configuration of a time to digital converter (TDC: Time to Digital Converter) according to an embodiment.

FIG. 10 is a circuit diagram which shows a configuration of a time to digital converter (TDC: Time to Digital Converter) 300 according to an embodiment. The time to digital converter 300 is mounted on a semiconductor test apparatus 400 together with a trigger signal generating unit 310. A DUT (device under test) 410 is connected to the semiconductor test apparatus 400. The trigger signal generating unit 310 generates a trigger signal Strig the level transition of which occurs at a predetermined timing.

The time to digital converter 300 employs the so-called Vernier method. The time to digital converter 300 receives a measurement target signal Smeas from the DUT 410 and a trigger signal Strig, converts the time difference Δt between the level transition timings of these two signals into a digital value, and outputs the resulting digital value. The semiconductor test apparatus 400 judges the quality of the DUT 410 or evaluates the properties of the DUT 410 based upon the digital value received from the time to digital converter 300.

The time to digital converter 300 includes a first multi-stage delay circuit 200_1, a second multi-stage delay circuit 200_2, sampling circuits SMP0 through SMPn, and an encoder ENC1.

The first multi-stage delay circuit 200_1 applies a delay to the input trigger signal Strig, and outputs, via n output terminals, n delayed trigger signals SDT1 through SDTn to which different respective delay times τa1 through τan have been applied. The delayed trigger signal SDTi, which is output from the i-th (i=1 to n) output terminal, is a signal obtained by delaying the trigger signal Strig by the corresponding delay time (i×τa). Here, τa represents a unit delay time applied by the first multi-stage delay circuit 200_1.

The second multi-stage delay circuit 200_2 applies delay times to the input signal Smeas to be measured, and outputs, via n output terminals, n delayed measurement target signals SDM1 through SDMn to which different delay times Tb1 through Tbn have been respectively applied. The delayed trigger signal SDMi, which is output from the i-th (i=1 to n) output terminal, is a signal obtained by delaying the measurement target signal Smeas by the corresponding delay time (i×τb). Here, Tb represents a unit delay time applied by the second multi-stage delay circuit 200_2.

The sampling circuit SMP0 performs sampling of the measurement target signal Smeas, which has not been subjected to any delay, using the trigger signal Strig, which has not been subjected to any delay. The sampling circuits SMP1 through SMPn are provided to the respective output terminals provided to the first multi-stage delay circuit 200_1 and the second multi-stage delay circuit 200_2. The i-th sampling circuit SMPi performs sampling of the delayed measurement target signal SDMi using the delayed trigger signal STDi received from the corresponding output terminal. That is to say, the output of the sampling circuit SMPi is the level of the delayed measurement target signal SDMi at each positive edge timing of the delayed trigger signal SDTi.

The encoder ENC1 receives the sampled signals S0 through Sn from the sampling circuits SMP0 through SMPn, and encodes the sampled signals thus received. Values obtained by converting the delay periods between the trigger signals Strig and the measurement target signals Smeas to digital values are employed as the encoded results.

At least one of, or both, the first multi-stage delay circuit 200_1 and the second multi-stage delay circuit 200_2 is, or are, configured employing the delay circuit 100 according to the embodiment. More preferably, the first multi-stage delay circuit 200_1 and the second multi-stage delay circuit 200_2 are each configured as the above-described multi-stage delay circuit 200a shown in FIG. 5 or the above-described multi-stage delay circuit 200b shown in FIG. 6. In this case, the multiple taps 9 shown in FIG. 5 or FIG. 6 are used as the output terminals of the first multi-stage delay circuit 200_1 and the second multi-stage delay circuit 200_2.

Description will be made regarding the operation of the time to digital converter 300 having such a configuration described above.

Here, the time difference between the edges of the measurement target signal Smeas and the trigger signal Strig is taken to be Δt, and the edge of the trigger signal Strig is taken to be advancing forward.

In a case in which τa>τb, the time difference between the edges of the measurement target signal Smeas and the trigger signal Strig is reduced by δτ (=τa−τb) with every stage at which a delay is applied. That is to say, the edges of the two signals draw closer as the two signals propagate through the first multi-stage delay circuit 200_1 and the second multi-stage delay circuit 2002, and at a certain stage, their position relation reverses.

In a case in which the sampled signals acquired at the stages before and after the j-th sampling circuit SMPj exhibit different values, the initial time difference Δt between the two edges is represented by the Expression Δt=j×δτ. The encoder ENC1 detects, based upon the sampled signals S0 through Sn, the stage j at which the sampled value is changed, and outputs the value of the stage j in the form of a digital value.

With the time to digital converter 300 described above, the time difference Δt between the edges of the two signals can be quantized with the time resolution δτ. By employing the delay circuit 100 shown in FIG. 1 as the first multi-stage delay circuit 200_1 and the second multi-stage delay circuit 200_2, such an arrangement is capable of providing the time resolution δτ with high precision.

If an inverter (buffer) is employed as such a delay element instead of the delay circuit 100 according to the embodiment, the offset time of each buffer cannot be set to 30 ps or less. Accordingly, to provide a sampling operation with a sampling rate of 1 GS/s, a resolution of 1 ps, and a measurement range of 1 ns, such an arrangement requires 1,000 buffer elements for each path, leading to enormous power consumption. Furthermore, with 1,000 units, it is difficult to correct irregularities in the delay times provided by the buffer elements.

In contrast, by employing the delay circuit 100 according to the embodiment, such an arrangement is capable of generating a delay time on the order of picoseconds with high precision. Thus, such an arrangement improves the time resolution and the linearity of the time to digital converter 300.

It should be noted that either the first multi-stage delay circuit 200_1 or the second multi-stage delay circuit 200_2 (preferably the multi-stage delay circuit having the smaller unit delay period) may be configured as a simple wiring line.

Figure 11:
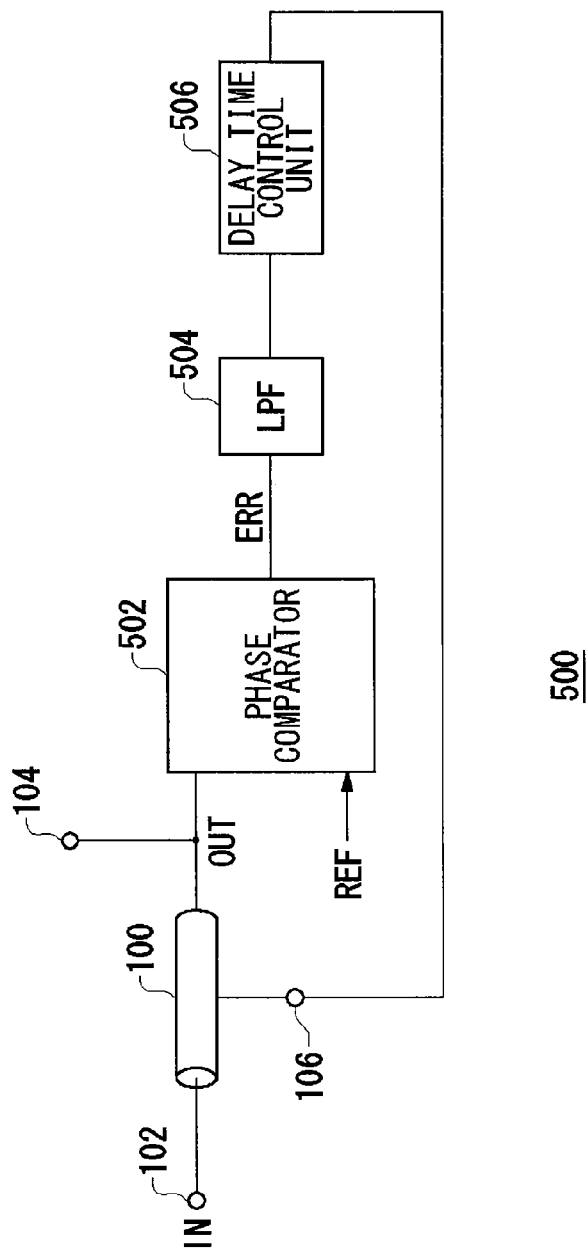
FIG. 11 is a circuit diagram which shows a delay lock loop circuit employing the delay circuit according the embodiment.

FIG. 11 is a circuit diagram which shows a delay lock loop circuit 500 employing the delay circuit 100 according to the embodiment. The delay lock loop circuit 500 includes a delay circuit 100, a phase comparator 502, an LPF (low-pass filter) 504, and a delay time control unit 506. Any one of the above-described delay circuits can be employed as the delay circuit 100. The delay circuit 100 applies a delay τ to the input signal IN. The phase comparator 502 receives the output signal OUT of the delay circuit 100 and a reference signal REF, and outputs a phase difference signal ERR that corresponds to the phase difference between the two signals. The LPF 504 functions as a loop filter, and performs filtering of the phase difference signal ERR received from the phase comparator 502. The delay time control unit 506 controls at least one of the drain voltage Vdd and the source voltage Vss of the MOSFET 1 of the delay circuit 100. Such an arrangement is capable of applying a desired phase delay to the input signal IN.

The delay lock loop circuit 500 shown in FIG. 11 may be employed as an internal component of the first multi-stage delay circuit 200_1 or the second multi-stage delay circuit 200_2 shown in FIG. 10. Such an arrangement is capable of adjusting the time resolution to a desired value.

As described above, the delay circuit 100 according to the embodiment is capable of adjusting the delay time according to the bias voltage. Description will be made below regarding a technique for adjusting the variation of the delay time by switching the bias voltage between two values.

Figure 12:
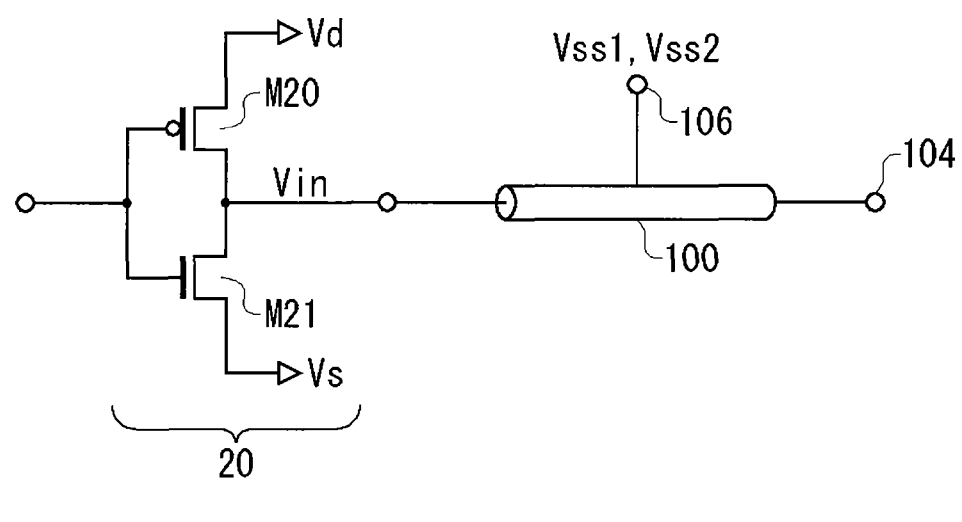
FIG. 12 is a circuit diagram which shows a modification of a delay circuit.

FIG. 12 is a circuit diagram which shows a modification of the delay circuit 100. A delay circuit 100b shown in FIG. 12 further includes a level shift circuit 20 provided as an upstream component of the MOSFET, in addition to the components of the delay circuit 100. The level shift circuit 20 shown in FIG. 12 is configured as a CMOS inverter including transistors M20 and M21. Furthermore, at least one of the source voltage (Vd) of the transistor M20 and the source voltage (Vs) of the transistor M21 is variable. The output signal of the level shift circuit 20, i.e., the input signal of the delay circuit 100 swings between the voltages Vd and Vs. It should be noted that the configuration of the level shift circuit 20 is not restricted to an inverter configuration. That is to say, the configuration of the level shift circuit 20 is not restricted in particular as long as it is capable of controlling the voltage level of the input signal of the delay circuit 100. Preferably, the level shift circuit 20 performs a level shift operation so as to reduce the amplitude of the input signal of the delay circuit 100.

Figure 13:
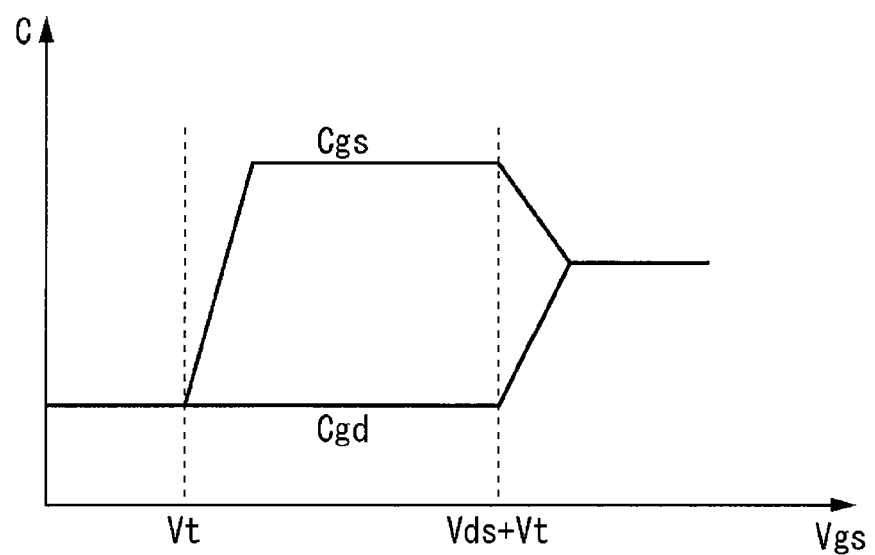
FIG. 13 is a graph which shows the gate-source capacitance Cgs and the gate-drain capacitance Cgd of the MOSFET.

FIG. 13 is a graph which shows the gate-source capacitance Cgs and the gate-drain capacitance Cgd of the MOSFET 1. The vertical axis represents the capacitance value, and the horizontal axis represents the gate-source voltage Vgs. In the cutoff region (Vg<Vt) and the saturation region (Vt<Vgs<Vds+Vt, where Vt represents the threshold voltage of the MOSFET), the capacitance Cgd exhibits a constant value, and rises in the linear region (Vgs>Vds+Vt). Moreover, the capacitance Cgs exhibits a constant value in the cutoff region, exhibits a maximum value in the saturation region, and exhibits a value on the order of Cgd in the linear region.

The capacitances Cgs and Cgd, which contribute the delay time of the delay circuit 100, depend on the level of the input signal Vin which propagates through the gate electrode 10. Thus, by providing the level shift circuit 20 as an upstream component of the delay circuit 100 as shown in FIG. 12, such an arrangement is capable of controlling the delay time.

FIGS. 14A and 14B are time charts for the delay circuit 100b shown in FIG. 12. FIGS. 14A and 14B each show, from the top and in the following order, the input voltage Vin, the source voltage Vss, the gate-source voltage Vgs, and the gate-source capacitance Cgs. Between FIG. 14A and FIG. 14B, there is a difference in the amplitude of the input signal Vin of the delay circuit 100. With the delay circuit 100, the source voltage Vss of the MOSFET 1 is switched between a first value Vss1 and a second value Vss2, and the drain voltage Vdd and the back gate voltage are each fixed. Vgs1 and Cgs1 shown in FIG. 14A and Vgs1' and Cgs1' shown in FIG. 14B represent the waveforms when the first value Vss1 is selected, and Vgs2 and Cgs2 shown in FIG. 14A and Vgs2' and Cgs2' shown in FIG. 14B represent the waveforms when the second value Vss2 is selected.

In a case in which the amplitude of the input voltage Vin is large as shown in FIG. 14A, the difference between the gate-source capacitances Cgs1 and the Cgs2 obtained by switching the source voltage Vss between the first value Vss1 and the second value Vss2 is small. On the other hand, as shown in FIG. 14B, by changing the amplitude and the level of the input signal Vin, such an arrangement is capable of increasing the capacitance difference between the gate-source capacitances Cgs1 and Cgs2 obtained by switching the source voltage Vss between the first value Vss1 and the second value Vss2. In the same way, such an arrangement is capable of controlling variation of the gate-drain capacitance by adjusting the level of the input signal Vin.

As described above, by providing the level shift circuit 20 as an upstream component of the delay circuit 100, and by adjusting the level of the signal which propagates through the gate electrode 10 included in the delay circuit 100, such an arrangement is capable of controlling the gate-source capacitance Cgs and the gate-drain capacitance Cgd. Thus, such an arrangement is capable of controlling the delay time provided by the delay circuit 100.

Figure 15:
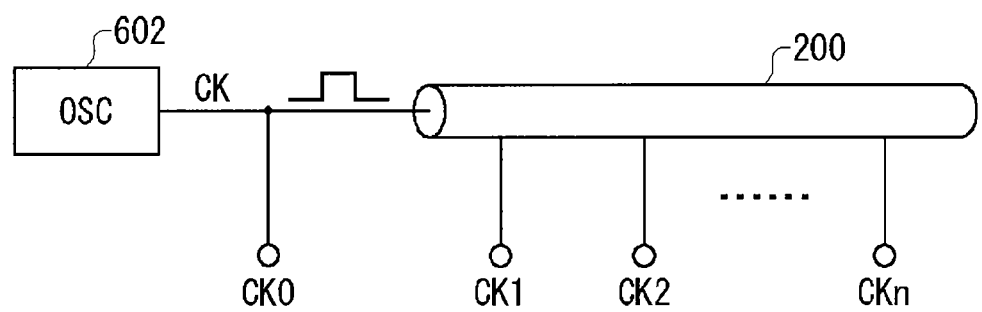
FIG. 15 is a circuit diagram which shows a configuration of a multi-phase clock generating circuit employing the multi-stage delay circuit according to the embodiment.

FIG. 15 is a circuit diagram which shows a configuration of a multi-phase clock generating circuit 600 employing the multi-stage delay circuit 200 according to the embodiment. The multi-phase clock generating circuit 600 includes the phase comparator 502 and the multi-stage delay circuit 200. The multi-stage delay circuit 200 may be configured as any one of the multi-stage delay circuits shown in FIGS. 5 through 8.

An oscillator 602 generates a clock signal CK with a cycle period Tp. The following relation is preferably satisfied between the unit delay time t and the cycle period Tp of the clock signal CK.

$$Tp = \tau \times (n+1)$$

Here, "n" represents the number of the stages of the multi-stage delay circuit 200.

Figure 16:
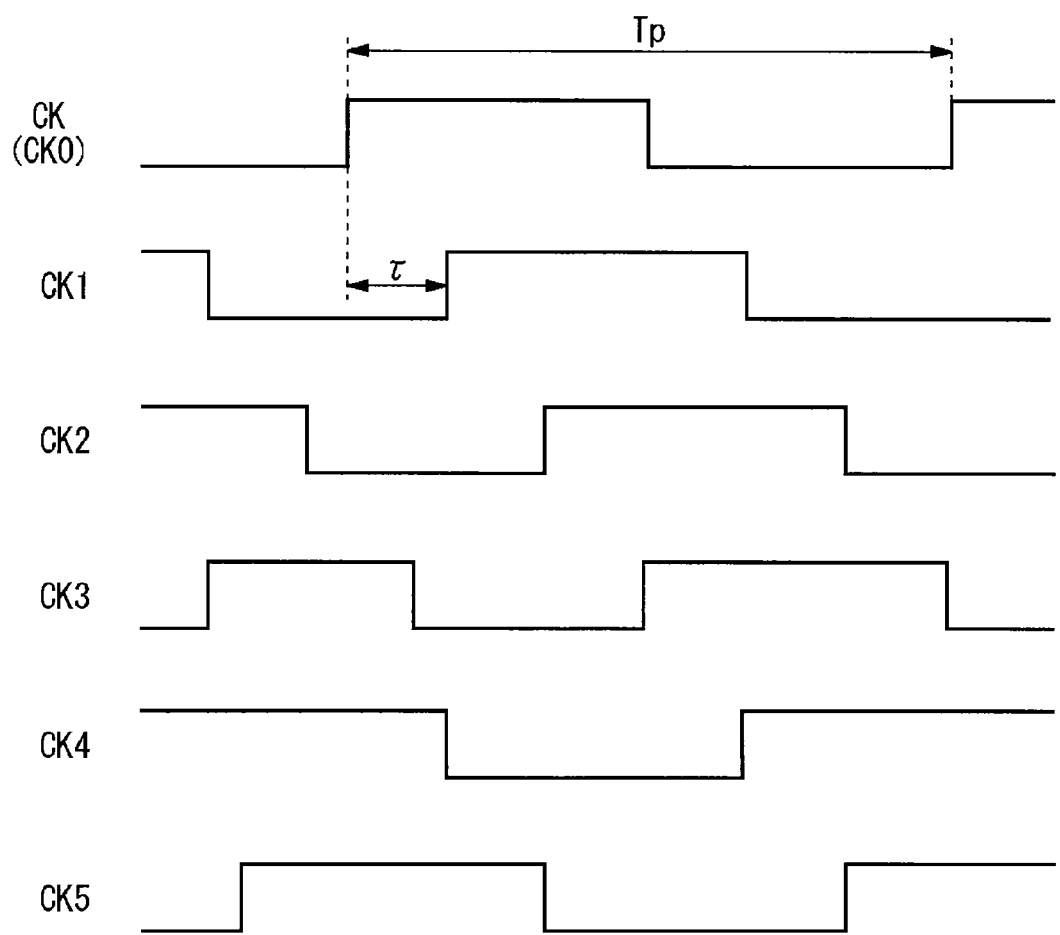
FIG. 16 is a time chart for the multi-phase clock generating circuit shown in FIG. 15.

FIG. 16 is a time chart for the multi-phase clock generating circuit 600 shown in FIG. 15. FIG. 16 shows an arrangement in which n=5. The multi-phase clock generating circuit 600 is capable of generating (n+1) clock signals CK0 through CKn by shifting the phase in increments of unit delay times τ using the clock signal CK as the reference signal. With such an arrangement, the unit of delay time τ can be adjusted with high precision. Thus, such an arrangement is capable of adjusting the phase difference between the clocks CK0 through CK5 with high precision.

Figure 17:
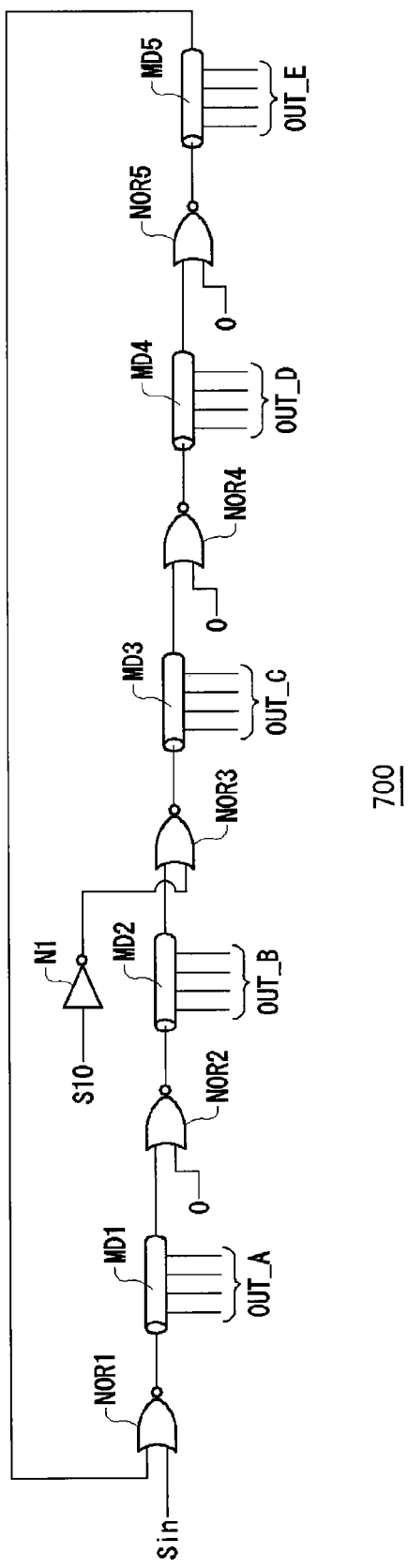
FIG. 17 is a circuit diagram which shows a configuration of a ring oscillator according to an embodiment.

Next, description will be made regarding a ring oscillator. FIG. 17 is a circuit diagram which shows a configuration of a ring oscillator 700 according to an embodiment. The ring oscillator 700 includes m (m represents an integer) multi-stage delay circuits MD1 through MD5 (m=5) and m NOR gates NOR1 through NOR5. One terminal of each of the NOR gates (NOR2, NOR4, and NOR5) receives "0" as an input signal, and thus the functions of such a NOR gate are substantially those of a NOT gate. The NOR gate NOR3 receives a stop signal S10 via the NOT gate N1. A NOT gate (inverter) may be employed instead of such a NOR gate.

The m NOR gates NOR1 through NOR5 and the multi-stage delay circuits MD1 through MD5 are alternately connected in the form of a ring. The multi-stage delay circuits MD1 through MD5 each have n (n represents an integer, n=4 in FIG. 17) output terminals, and each applies a delay to the input signal and outputs n delayed signals to which different delay times have been applied. The above-described multi-stage delay circuit 200 can be employed as the multi-stage delay circuits MD1 through MD5. It should be noted that other multi-stage delay circuits having different configurations may be employed. Wiring lines having taps may be employed as such a multi-stage delay circuit having a different configuration. In this case, each wiring line may be formed using the pattern shown in FIG. 7.

Figure 18:
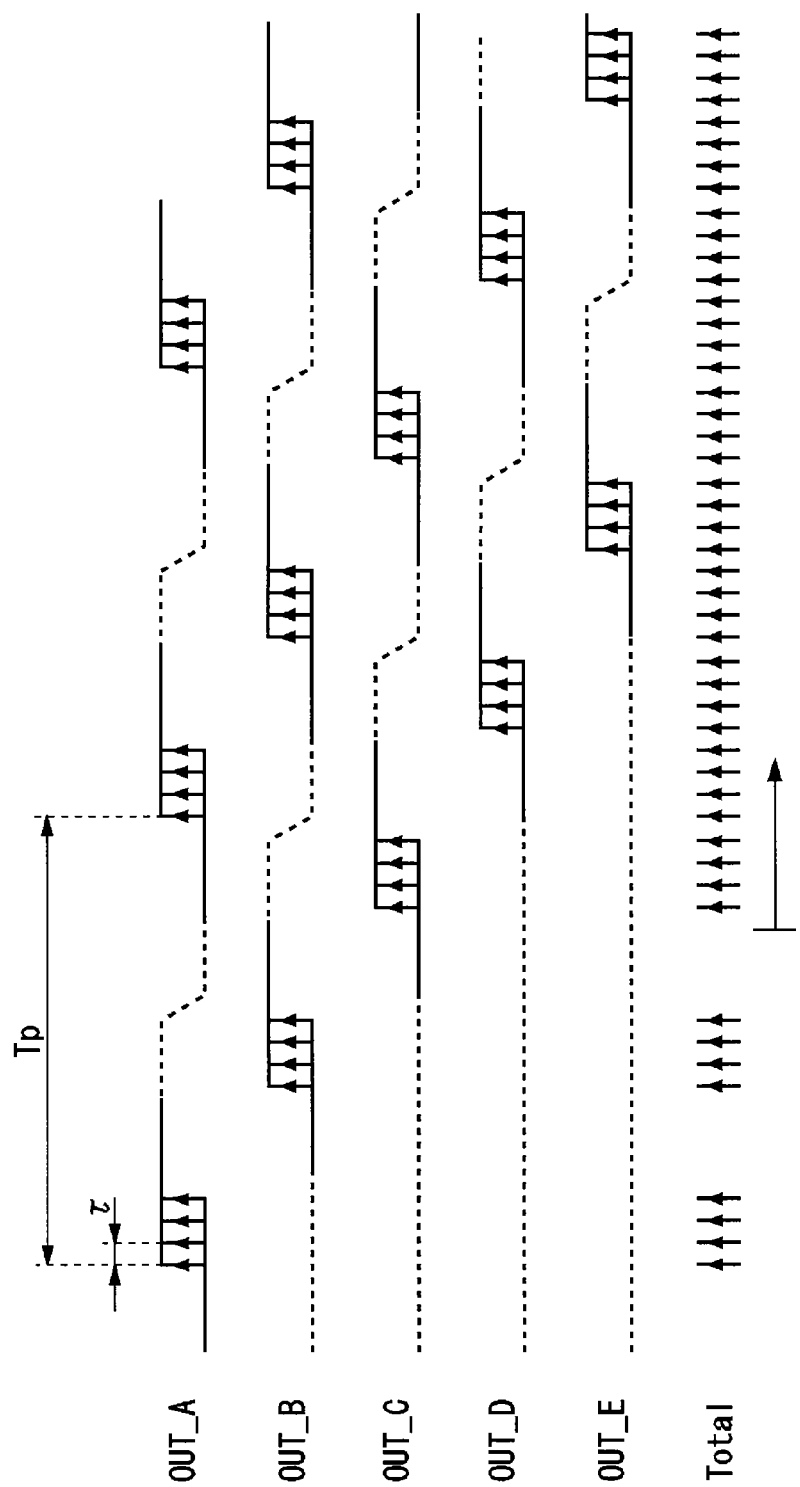
FIG. 18 is a time chart for the ring oscillator shown in FIG. 17.

FIG. 18 is a time chart for the ring oscillator 700 shown in FIG. 17. The multi-stage delay circuit MD1 outputs pulse signals OUT_A having different phases which have been shifted in increments of the unit delay time τ. In the same way, the multi-stage delay circuits MD2 through MD5 output pulse signals OUT_B through OUT_E. All of the edges of the pulse signals OUT_A through OUT_E occur in increments of the unit delay time τ. Thus, such an arrangement is capable of generating sequential timing signals at constant intervals.

By applying the multi-stage delay circuit 200 according to the embodiment to the ring oscillator 700 shown in FIG. 17, such an arrangement is capable of controlling the interval between the timing signals with high precision.

The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

For example, in order to control the delay amounts of the delay circuit 100 and the multi-stage delay circuit 200, the following technique may be employed.

Figure 19A:
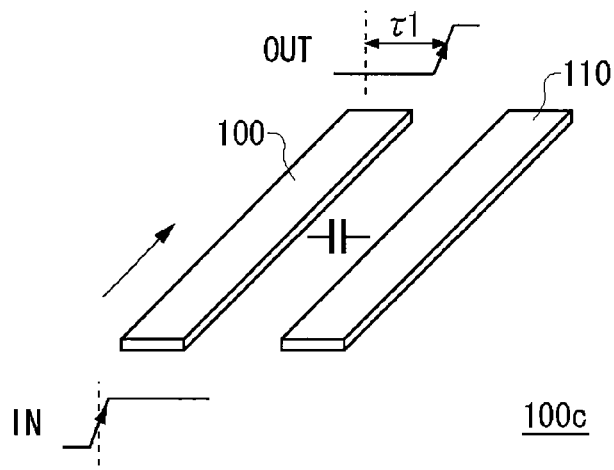
FIGS. 19A through 19C are diagrams each showing a configuration of a delay circuit employing an adjacent wiring line.
Figure 19B:
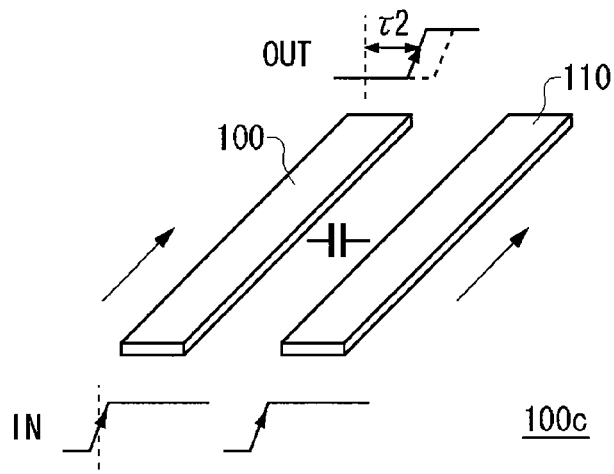
Figure 19C:
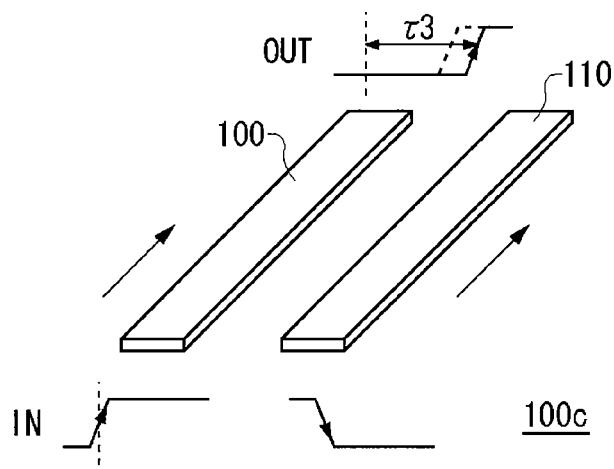

A dummy wiring line may be provided in the vicinity of the gate electrode 10 (or metal wiring line 9) through which the signal to be delayed propagates. FIGS. 19A through 19C show the configuration of a delay circuit 100c employing an adjacent wiring line. The delay circuit 100c includes an adjacent wiring line 110, in addition to the above-described delay circuit 100. The adjacent wiring line 110 is provided adjacent to, and preferably parallel to, the delay circuit 100 which functions as a signal wiring line. In this case, there is wiring capacitance (parasitic capacitance) between the adjacent wiring line 110 and the gate electrode 10 of the delay circuit 100. Thus, such an arrangement is capable of adjusting the delay amount τ provided by the delay circuit 100. In general, the wiring capacitance is determined by physical characteristics (dielectric constant, surface area, wiring interval, wiring length, wiring pattern).

The delay amount may be adjusted by causing a signal to propagate through the adjacent wiring line 110. FIG. 19B shows a circuit in which an in-phase signal Sip having the same phase as that of the input signal IN to be delayed is caused to propagate through the adjacent wiring line 110. The "same phase" means that, when the input signal IN rises, the in-phase signal Sip rises at the same time, and when the input signal IN falls, the in-phase signal Sip falls at the same time. In a case in which the in-phase signal Sip propagates through the adjacent wiring line 110, the electric field lines produce a mutual repulsion. This is equivalent to an increase in the interval between the wiring lines, which reduces the wiring capacitance. As a result, the propagation delay time τ2 is reduced as compared to the propagation delay time τ1 provided by an arrangement shown in FIG. 19A that does not involve propagation of such an in-phase signal Sip.

FIG. 19C shows a circuit through which a reverse-phase signal Sop, which has the reverse phase to that of the input signal IN to be delayed, is caused to propagate through the adjacent wiring line 110. The "reverse phase" means that, when the input signal IN rises, the reverse-phase signal Sop falls at the same time, and when the input signal IN falls, the reverse-phase signal Sop rises at the same time. In a case in which the reverse-phase signal Sop propagates through the adjacent wiring line 110, the electric field lines produce a mutual attraction. This is equivalent to a reduction in the wiring interval, which increases the wiring capacitance. As a result, the propagation delay time τ3 is increased as compared with the propagation delay time τ1 provided by an arrangement shown in FIG. 19A that does not involve propagation of such an reverse-phase signal Sop.

As described above, with the delay circuit 100c shown in FIG. 19A through FIG. 19C, by changing the phase of a signal to be propagated through the adjacent wiring line 110, such an arrangement is capable of controlling the propagation delay time τ provided by the delay circuit 100.

Figure 20:
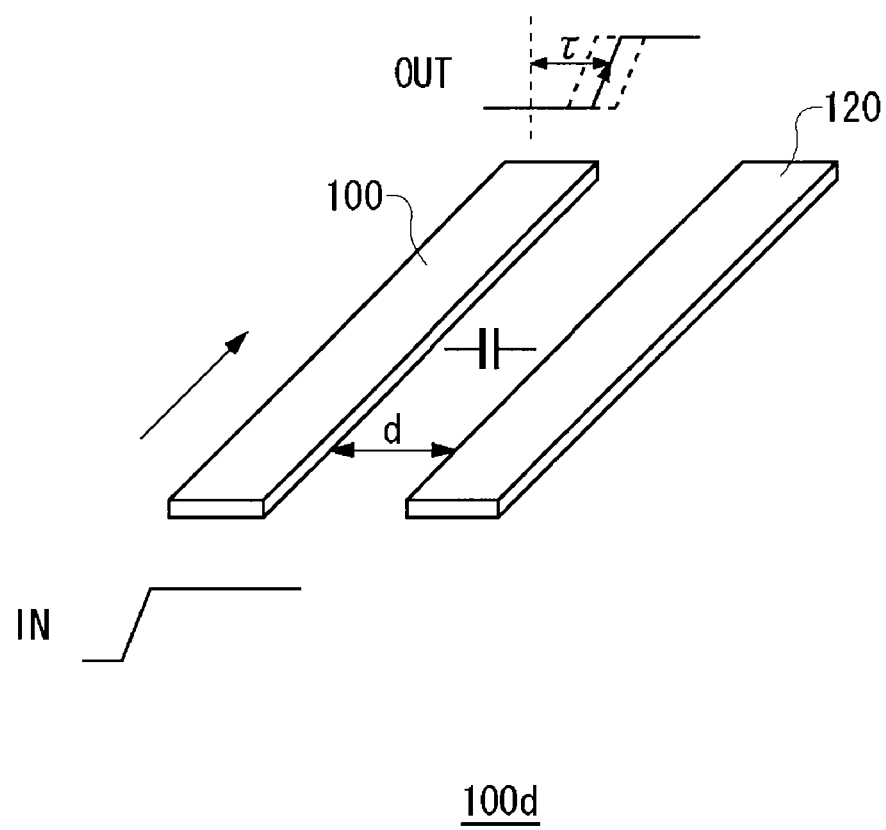
FIG. 20 is a diagram which shows a configuration of a delay circuit 100d using MEMS.

Also, an arrangement may be made which allows the distance between the adjacent wiring line and the gate electrode 10 to be adjusted using MEMS (Micro Electro Mechanical Systems). FIG. 20 is a diagram which shows a configuration of a delay circuit 100d using MEMS. The delay circuit 100d includes the above-described delay circuit 100 and an adjacent wiring line 120. The adjacent wiring line 120 is provided in the vicinity of, and preferably parallel to, the delay circuit 100 which functions as a signal wiring line. The adjacent wiring line 120 is configured to allow the wiring interval d to the delay circuit 100 to be adjusted using the MEMS technique. The wiring capacitance changes as the wiring interval d changes, and thus such an arrangement is capable of controlling the propagation delay time τ provided by the delay circuit 100. It should be noted that a signal may be propagated through the adjacent wiring line 120 as shown in FIG. 19B or 19C.

Description has been made with reference to the delay circuits 100c and 100d shown in FIG. 19 and FIG. 20 regarding an arrangement in which the input signal In to be delayed is propagated through the above-described delay circuit 100. Also, such techniques can be applied to an arrangement where the main delay circuit 100 is replaced by other delay circuits. In other words, the following idea can be derived. That is to say, a delay circuit according to an embodiment includes a delay circuit configured to propagate a signal to be delayed, and an adjacent wiring line provided in parallel with the delay circuit, i.e., provided in the propagation direction along which the signal to be delayed is propagated. Also, in such an arrangement, a pulse signal, having the same phase, the reverse phase, or an intermediate phase with respect to the signal to be delayed, may be propagated through the adjacent wiring line. Also, the adjacent wiring line may be configured such that it is movable by means of the MEMS technique, thereby adjusting the wiring interval between the delay circuit and the adjacent wiring line.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

The invention claimed is:

1. A ring oscillator, comprising:
   at least one multi-stage delay circuit, each multi-stage delay circuit including at least one output terminal and being configured to apply delay times to a respective input signal and to output at least one delayed signal to which different delay times have been applied via the at least one output terminal; and
   at least one inverter,
   wherein the at least one multi-stage delay circuit and the at least one inverter are connected in the form of a ring; and
   wherein the at least one multi-stage delay circuit comprises:
   a MOSFET (Metal Oxide Semiconductor Field Effect Transistor);
   a voltage source configured to apply a voltage difference between a drain and a source of the MOSFET; and
   a plurality of taps drawn from a gate electrode of the MOSFET,
   wherein a signal to be delayed is propagated through the gate of the MOSFET in the gate width direction,
   and wherein a plurality of delayed signals, which have been obtained by applying different delay times to the signal to be delayed, are output via the plurality of taps.

2. A ring oscillator according to claim 1, wherein the voltage source is capable of adjusting at least one voltage from among a voltage at the drain of the MOSFET, a voltage at the source thereof, and a voltage at a back gate thereof.

3. A ring oscillator according to claim 1, wherein a plurality of MOSFETs are provided,
   and wherein the gate electrodes of the MOSFETs are connected in series so as to form a single propagation line.

4. A ring oscillator according to claim 3, wherein the drain electrodes of the plurality of MOSFETs are connected so as to form a common drain electrode, and the source electrodes thereof are connected so as to form a common source electrode, and wherein a common drain voltage and a common source voltage are respectively applied to the common drain electrode and the common source electrode thus foamed.

5. A ring oscillator according to claim 3, wherein at least one set of electrodes from among the drain electrodes of the plurality of MOSFETs and the source electrodes thereof is provided in the form of separate electrodes provided in increments of MOSFETs, and wherein different bias voltages can be applied to the separate electrodes.

6. A ring oscillator according to claim 1, further comprising a metal wiring line formed in the gate width direction such that it is overlaid on a gate polysilicon layer of the MOSFET, and wherein the metal wiring line is electrically connected to the polysilicon layer.

7. A ring oscillator according to claim 1, further comprising a level shifter arranged as an upstream component of the MOSFET, and configured to adjust the voltage level of the signal to be delayed.

8. A ring oscillator according to claim 7, wherein the level shifter is configured to reduce the amplitude of the signal to be delayed.

9. A ring oscillator according to claim 1, further comprising an adjacent wiring line formed in parallel with the MOSFET along the gate width direction.

10. A ring oscillator according to claim 9, wherein a pulse signal is propagated through the adjacent wiring line so as to control the phase difference between the pulse signal and the signal to be delayed.

11. A ring oscillator according to claim 9, wherein the adjacent wiring line is configured such that it can be physically moved using MEMS (Micro Electro Mechanical Systems), thereby allowing the interval between the adjacent wiring line and the MOSFET to be adjusted.

12. A ring oscillator according to claim 1, wherein the wiring width of the wiring line through which a signal is to be propagated is varied in increments of the intervals between the plurality of taps.

13. A ring oscillator according to claim 1, wherein the overall wiring width of the line through which the signal is propagated is constant irrespective of which tap is selected from among the taps arranged along the line.

14. A ring oscillator, comprising:
at least one multi-stage delay circuit, each multi-stage delay circuit including at least one output terminal and being configured to apply delay times to a respective input signal and to output at least one delayed signal to which different delay times have been applied via the at least one output terminal; and
at least one inverter,
wherein the at least one multi-stage delay circuit and the at least one inverter are connected in the form of a ring; and
wherein each of the at least one multi-stage delay circuit is configured to output at least one delayed signal having the same polarity.

15. A ring oscillator, comprising:
at least one multi-stage delay circuit, each multi-stage delay circuit including at least one output terminal and being configured to apply delay times to a respective input signal and to output at least one delayed signal to which different delay times have been applied via the at least one output terminal; and
at least one inverter,
wherein the at least one multi-stage delay circuit and the at least one inverter are connected in the form of a ring; and
wherein an inverting delay circuit among at least one inverting delay circuit is formed by connecting a multi-stage delay circuit among the least one multi-stage delay circuit with an inverter among the at least one inverter and the at least one inverting delay circuit is connected in the form of a ring.

* * * * *